United States Patent [19]
Flora

[11] 3,961,284
[45] June 1, 1976

[54] OSCILLATOR CONTROL CIRCUIT

[75] Inventor: Laurence Paul Flora, Covina, Calif.

[73] Assignee: Burroughs Corporation, Detroit, Mich.

[22] Filed: Aug. 1, 1975

[21] Appl. No.: 601,198

[52] U.S. Cl. ................. 331/116 R; 331/108 D; 331/159
[51] Int. Cl.² ................................. H03B 5/36
[58] Field of Search ........ 331/116 R, 108 C, 108 D, 331/113 R, 144, 159

[56] References Cited
UNITED STATES PATENTS

| | | | |
|---|---|---|---|
| 3,613,029 | 10/1971 | Bartlett | 331/108 D |
| 3,911,378 | 10/1975 | Buchanan | 331/108 C |
| 3,916,345 | 10/1975 | Eberlein | 331/116 R |

OTHER PUBLICATIONS

Low Duty Cycle Sig. Gen., E. L. Dobbyn, Tech. Digest No. 35, July 1974.

Primary Examiner—John Kominski
Attorney, Agent, or Firm—Arthur Decker; Nathan Cass; Kevin R. Peterson

[57] ABSTRACT

Disclosed is a circuit for locking a harmonic-rich oscillator, such as the crystal-controlled type, to provide as its output, a signal at a designated frequency characterized by minimum harmonic content and high stability. The circuit includes a combination of gates in the oscillatory feedback path controlled by single-shot multivibrators with time constants such that any tendency of the period of the output signal to compress or expand is overridden by the respective expansion or compression thereof by the appropriate single-shots.

9 Claims, 5 Drawing Figures

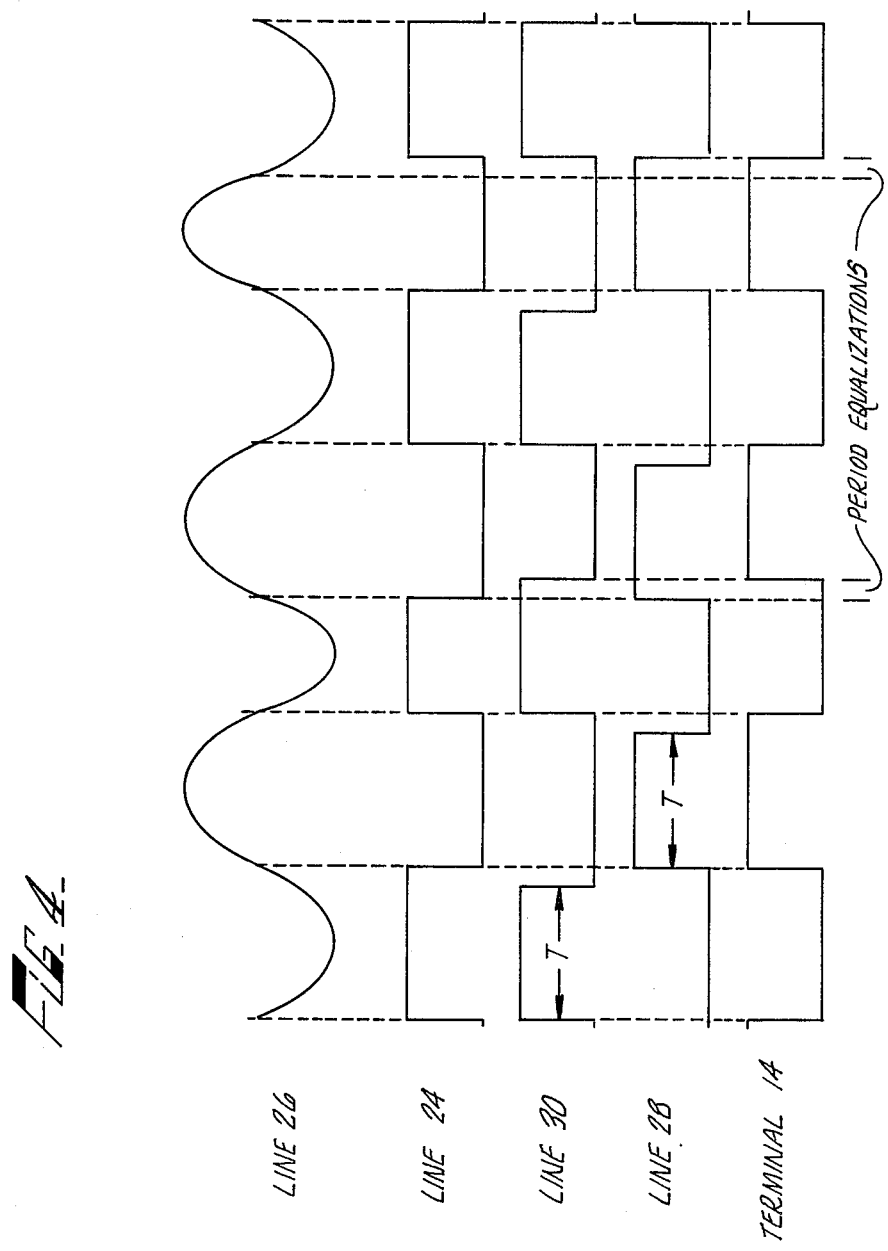

OSCILLATOR CONTROL CIRCUIT

BACKGROUND OF THE INVENTION

In the generation of continuous pulse trains, such as the rectangular-wave signal which is commonly used to synchronize the components (e.g., flip-flops, gates, input-output peripherals) of digital computers, wide use is made of sine-wave oscillators followed by clipping and/or other pulse-shaping circuits. Frequently, in order to achieve a high order of stability without costly complications, crystals are incorporated in the circuitry to establish the frequency of oscillation. However, crystal oscillators inherently produce output signals rich in harmonic content. Presuming that what is desired is that the circuit be permitted to issue, for instance, its fundamental frequency only, it is required that there be provision for insuring that it "lock" to the fundamental to the exclusion of all the harmonics. Several ways of accomplishing this are known. Firstly, there may be used a crystal with a lower impedance at the desired harmonic in an oscillator circuit in which that impedance is a critical factor; the disadvantage here is that special precautions must be taken to insure that the crystal has the correct properties and close constraints thereon make it difficult to use production-quality units. Alternatively, additional frequency sensitive networks may be added to the oscillator loop, thereby, usually, adding a large phase shift at any frequency other than that desired; this requires that the rest of the oscillator loop be sensitive to the added phase shift, and may require the inclusion of special provisions to insure that the added phase shift inhibits oscillation. Also the additional frequency sensitive networks are often an inherent part of an amplifier, thus effectively limiting the oscillation frequency to an upper bound; a problem with this approach is that it is difficult to guarantee the upper frequency characteristics of an amplifier unless control is a function of the values of passive components instead of the limitations of active devices. This requires active devices with upper frequency limits certified to be higher than the frequency cutoff of the amplifier, a requirement not always readily accomplished.

If a crystal oscillator is considered in the time domain instead of the frequency domain, i.e., if bounds (upper and/or lower limits) are placed on the period of the output the use of one-shot timers and appropriate gates suggests several advantages. Firstly, circuit structure and operation are ideal for understanding by logicians of the computer field; analog amplifiers, filters, etc. need not be investigated or constructed. Secondly, the components are functionally the same as used in the rest of the logic system; thus, there is no need for special packaging for the clock oscillator circuits, for example. Thirdly, correct harmonic lock-on is assured by the one-shots; there are no phase margins or gain margins to calculate or compensations for any unexpected circuit parameter changes to include in the design.

SUMMARY OF THE INVENTION

This, then, is the approach to oscillator circuitry taken by the present invention. Specifically provided is a crystal oscillator having a pair of gates serially connected in its feedback path and a set of single-shot multivibrators cooperating with the gates. For one embodiment, for which signal period minimization (i.e., low pass) is desired, a pair of gates of the NOR type (Peirce circuits) are employed whereas, for another embodiment, for which signal period maximization (i.e., high pass) is desired, a pair of gates of the NAND type (Sheffer stroke circuits) are employed. Still another aspect of the invention teaches how the aforementioned embodiments may be combined to provide both bounds for the signal period (i.e., band pass).

DESCRIPTION OF THE DRAWINGS

FIG. 4 is a set of idealized wave-shape diagrams at various points of FIG. 1 selected to demonstrate its operation.

DESCRIPTION OF THE PREFERRED EMBODIMENTS

The preferred embodiments of the invention depicted in the figures are oscillator circuits in which the frequency-determining element is piezoelectric (a crystal), and oscillations thereof are maintained by a positive feedback path between the two crystal terminals.

Figure 1B:
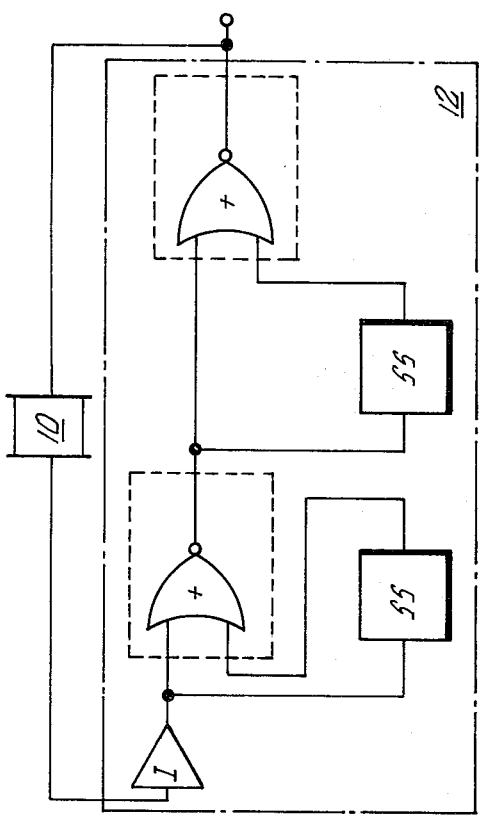
FIGS. 1a and 1b are embodiments of oscillator circuits which include means according to the invention to provide a lower bound on the period of the output signal.
Figure 1A:
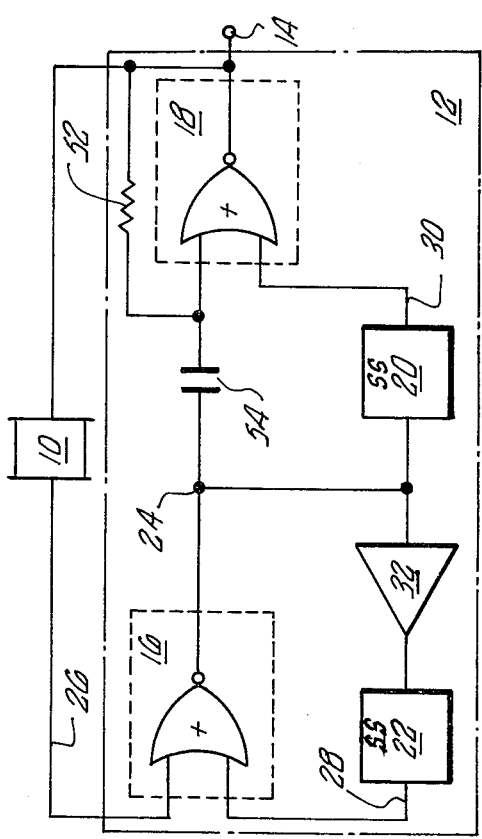

Specifically, FIG. 1 is arranged so that elements in the feedback path lock the oscillation period to synchronize with the crystal fundamental and discriminate against, for instance, the odd harmonics which, as well known, crystal oscillators tend to generate readily. Thus, with reference to FIG. 1a, crystal 10 is paralleled by feedback path 12, which contains elements and interconnections required to sustain oscillations manifest at terminal 14. The elements in feedback path 12 comprise, in this case, a pair of gates 16, 18 and a pair of single-shot multivibrators 20, 22. Both gates 16, 18 perform the same logic, namely, the NOR function, according to which output line 24 is at an effective logic level (e.g. + 10 volts) only if both input lines 26, 28 are in coincidence at an ineffective logic level (e.g. 0 volts) and terminal 14 is at 10 volts only if both lines 24, 30 are at 0 volts; this logic may be represented algebraically as $24 = 26' \cdot 28'$ and $14 = 24' \cdot 30'$, respectively. Single-shots 20, 22 are identical, both triggered by positive-going input transitions, the former form line 24 directly but the latter from line 24 indirectly through inverter 32 and thus actually responsive to negative-going transitions on line 24.

Gates 16, 18 and single-shots 20, 22 (as well as crystal 10) are components which have been well divulged in the engineering art and therefore will not be detailed further here; for instance, reference for the former may be made to chapters 3 and 4 of the book "Logical Design of Digital Computers" by M. Phister, Jr., Wiley, New York, 1958, and for the latter to the application note "The 9601, a Second Generation Retriggerable One-Shot," APP 173, by T. Gray, et al., March 1969, Fairchild Semiconductor, Mountain View, Ca., structured with an R-C network time constant to provide a pulse width slightly less in duration than the period of one half-wave of the fundamental frequency of crystal 10. Further, for an identification of the functions of graphic symbols in the figures, reference may be made to the compilation by the editors of Electronics found in the Apr. 3, 1975 issue thereof.

An example of the computation of the pulse width of single-shots 20, 22, based on the object of preventing circuit oscillations at the third harmonic of the natural fundamental of crystal 10 would specify as follows:

$$\frac{1}{2f_1} > T > \frac{1}{6f_1}$$

where
T = pulse width
$f_1$ = fundamental

The above assures that each half-period of circuit output is longer than the half-period $$\left(\frac{1}{6f_1}\right)$$

of the third harmonic, and thus, output at that frequency is inhibited.

An example of the activity of the circuit shown in FIG. 1a is given in FIG. 4, a set of idealized waveshape diagrams for certain lines and terminals.

The first full-wave output of crystal 10 (line 26) indicates normal, i.e., on fundamental frequency, oscillation of the circuit; the waveshape for terminal 14 illustrates the output of the circuit. It is apparent that the latter "follows" the former and the triggering of single-shots 20, 22 (lines 30, 28, respectively), by the gate 16 signal leading and trailing edges, respectively, does not affect the output, since the single-shots both revert within a half-period.

The next half-cycle output of crystal 10 (line 26), is negative and shortened and, as before, gate 16 triggers single-shot 20 (line 30) at the leading pulse edge of the line 24 waveshape and single-shot 22 (line 28) at the trailing pulse edge. However, the circuit output, at terminal 14, does not switch at the end of the negative half-cycle since the output of single-shot 20 (line 30) is passed through gate 18. The output period is thus extended beyond the half-period of crystal 10 by the difference between the half-period and the pulse width of single-shot 20. Crystal 10 is thus locked at its fundamental for the next full cycle.

The succeeding positive half-cycle is again shown as shortened. This time only single-shot 22 is triggered (line 28), thereby keeping terminal 14 from switching at the negative-going crossover point of the signal on line 26.

From the above, it is apparent that the circuit of FIG. 1a contains provision for imposing a minimum oscillation period (i.e., maximum frequency) on crystal 10; of course, oscillations may occur at a lower frequency, but it has been noted that, if time constant T of single-shots 20, 22 contemplates a maximum frequency between the fundamental and second harmonic of crystal 10, the oscillator can be depended upon to lock on the fundamental.

It will also be noted that included in the circuit is provision for self-start of oscillations, comprising, as is typical in crystal-controlled oscillators which use digital circuitry having built-in amplification, resistor 52 connected between output terminal 14 and the input of gate 18; capacitor 54, connected between gates 16 and 18 provides isolation and coupling.

FIG. 1b shows an alternative arrangement of the FIG. 1a circuit for the accomplishment of the same objective, i.e., the maximization of the oscillation frequency. Operation of this circuit is sufficiently similar to that of FIG. 1a so that the foregoing description thereof will suffice for one skilled in the art; accordingly, it will not be detailed further.

Figure 2:
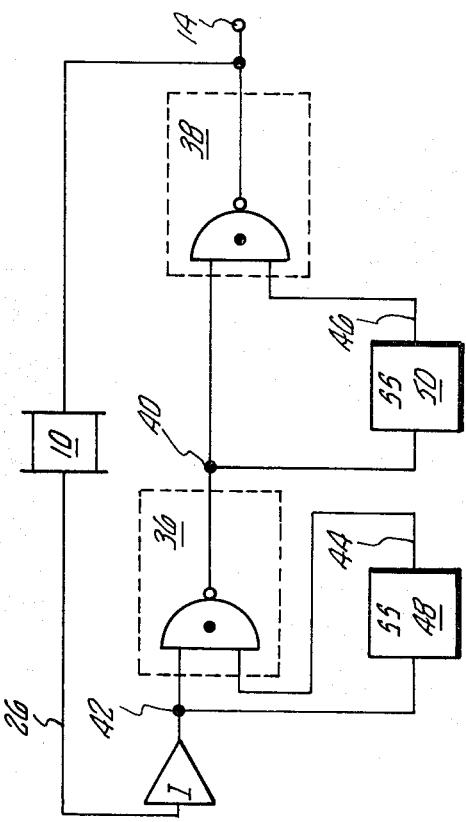
FIG. 2 is a oscillator circuit which includes means to provide an upper bound on the period.

The invention has been extended to a structure which minimizes the frequency at which a circuit may oscillate; for purposes of illustration here, the circuit of FIG. 1b has been chosen. It is apparent, as FIG. 2 shows, that the only modification required is to the logic performed by gates 16, 18 (renumbered as gates 36, 38): the required logic is the NAND function, according to which line 40 is at 0 volts only if both input lines 42, 44 are in coincidence at 10 volts and terminal 14 is at 0 volts only if both lines 40, 46 are at 10 volts. As in the case of FIG. 1b, the operation of the circuit of FIG. 2 is considered clear to those trained in electronics and will not be derived. It should be apparent that single-shots 48, 50 each limit a half-cycle of oscillation to a maximum period: if a half-period tends to extend, a corresponding single-shot cuts it off at a time corresponding to that for which the single-shot time constants have been selected. Obviously, if the selection corresponds to a maximum frequency between the fundamental of crystal 10 and its second harmonic, the fundamental will be locked out and the oscillator will provide output at a higher harmonic.

Figure 3:
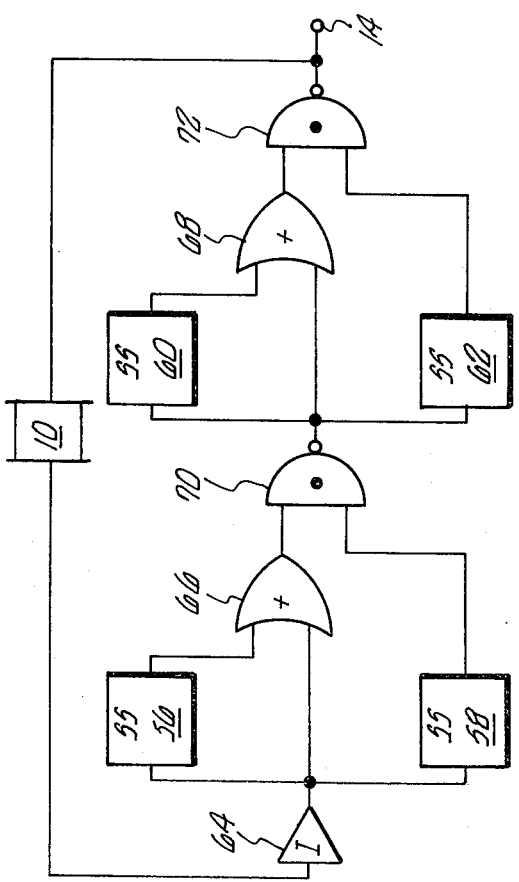
FIG. 3 shows how the technique of the invention may be employed to provide an oscillator with a band pass characteristic.

FIG. 3 shows how the circuits of FIGS. 1 and 2 may be combined to provide an oscillator forced to provide output at a predetermined harmonic (e.g., the fifth) of crystal 10 even though this harmonic is not normally preferred by the crystal-amplifier feedback loop arrangement. Here, the lower and upper constraints on the period are a function of single-shots 56, 58, 60, 62 whereas logical levels and appropriate signal routing to terminal 14 are established by inverter-amplifier 64, OR gates 66, 68 (for which the output is at the effective logic level only if at least one input is at the effective level) and NAND gates 70, 72.

It is recognized that, to some extent, the drawings and this description provide a rather broad teaching of the present invention. It is submitted that this is justified in view of the supplementary information easily available to those skilled in the computer arts. It is submitted that the logic and detailed circuitry may be structured by such practitioners along the guidelines established in the works referenced previously. Also, it will readily be appreciated that this specification implies no structural limitations to those acquainted with computers or logic design; in brief, the present description should be considered exemplary for teaching those skilled in the computer arts and not constrained to the showing herein or in the aforementioned references.

What is claimed is:

1. In an oscillator for which output is sustained by a feedback path for a harmonic-rich oscillating element, a frequency determining circuit in the feedback path, comprising:

a pair of single-shot multivibrators having relaxation periods between a quarter-period and a half-period of a desired oscillation harmonic and responsive to transitions in the output of the element, the first responsive to transitions to one polarity and the second responsive to transitions to the opposite polarity;

summing means for the output of each said multivibrator and the output of the element corresponding thereto; and means to connect the output of said summing means as feedback excitation for the element.

2. The oscillator of claim 1 in which the element is of the piezoelectric type.

3. The oscillator of claim 1 for which the periods of said multivibrators are equal.

4. The oscillator of claim 1 for which the periods of said multivibrators are substantially equal to the half-period of the desired harmonic.

5. The oscillator of claim 1 for which the desired harmonic is the element fundamental.

6. The oscillator of claim 1 in which said summing means comprises a pair of gates.

7. The oscillator of claim 6 in which said gates generate a NOR function.

8. The oscillator of claim 6 in which said gates generate a NAND function.

9. The oscillator of claim 1 and a second pair of single-shot multivibrators also having relaxation periods between a quarter-period and a half-period of a desired oscillation harmonic and also responsive to transitions in the output of the element, the first responsive to transitions to one polarity and the second responsive to transitions to the opposite polarity; and means to connect the outputs of each multivibrator of said second pair as input to said summing means.

* * * * *